United States Patent
Miao et al.

(10) Patent No.: US 9,184,143 B2
(45) Date of Patent: Nov. 10, 2015

(54) SEMICONDUCTOR DEVICE WITH BUMP ADJUSTMENT AND MANUFACTURING METHOD THEREOF

(71) Applicant: TAIWAN SEMICONDUCTOR MANUFACTURING COMPANY LTD., Hsinchu (TW)

(72) Inventors: Chia-Chun Miao, Hsinchu County (TW); Shih-Wei Liang, Taichung (TW); Kai-Chiang Wu, Hsinchu (TW); Yen-Ping Wang, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/098,218

(22) Filed: Dec. 5, 2013

(65) Prior Publication Data

US 2015/0162291 A1 Jun. 11, 2015

(51) Int. Cl.
  *H01L 23/00* (2006.01)
(52) U.S. Cl.
  CPC ............... *H01L 24/13* (2013.01); *H01L 24/11* (2013.01); *H01L 2924/15788* (2013.01)
(58) Field of Classification Search
  CPC .. H01I 24/13; H01I 24/11; H01I 2924/15788; H01I 2924/00; H01I 23/00
  USPC ......... 257/737, 738, 690, 528, 531, 532, 535, 257/734
  See application file for complete search history.

(56) References Cited

U.S. PATENT DOCUMENTS

| | | | | |
|---|---|---|---|---|
| 6,515,369 | B1* | 2/2003 | Lin | 257/773 |
| 8,581,400 | B2* | 11/2013 | Liang et al. | 257/737 |
| 8,902,123 | B2* | 12/2014 | Dairiki et al. | 343/893 |
| 2007/0296037 | A1* | 12/2007 | Dozen et al. | 257/350 |
| 2008/0035972 | A1* | 2/2008 | Lin | 257/296 |
| 2009/0068347 | A1* | 3/2009 | Lotfi et al. | 427/131 |
| 2009/0068400 | A1* | 3/2009 | Lotfi et al. | 428/138 |
| 2010/0219513 | A1* | 9/2010 | Zhang et al. | 257/659 |
| 2011/0094996 | A1* | 4/2011 | Yamazawa et al. | 216/68 |
| 2011/0284912 | A1* | 11/2011 | Sekine et al. | 257/99 |
| 2012/0070956 | A1* | 3/2012 | Nagata | 438/381 |
| 2013/0113097 | A1* | 5/2013 | Yu et al. | 257/738 |
| 2013/0134580 | A1* | 5/2013 | Bao et al. | 257/737 |
| 2013/0187277 | A1* | 7/2013 | Chen et al. | 257/762 |
| 2013/0228897 | A1* | 9/2013 | Chen et al. | 257/621 |
| 2014/0080118 | A1* | 3/2014 | Bates et al. | 435/5 |

* cited by examiner

*Primary Examiner* — Alexander Oscar Williams
(74) *Attorney, Agent, or Firm* — Chun-Ming Shih

(57) ABSTRACT

A semiconductor device having a semiconductor substrate is provided. The semiconductor device has a metal structure over the semiconductor substrate. The metal structure is configured to receive a bump. The semiconductor device further has a conductive trace between the semiconductor substrate and the metal structure. The conductive trace is configured to connect to a power source. When an electric current from the power source passes through the conductive trace, an electromagnetic field is generated at the conductive trace. The position of the bump is adjusted in response to the electromagnetic field.

20 Claims, 8 Drawing Sheets

SEMICONDUCTOR DEVICE WITH BUMP ADJUSTMENT AND MANUFACTURING METHOD THEREOF

FIELD

The present disclosure relates to a semiconductor device and method of forming the same.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as via openings and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump is disposed on the surface of a semiconductor substrate. The bump is then treated to maintain its position on the semiconductor substrate.

In addition to Flip-chip packaging, Wafer level chip scale packaging (WLCSP) is currently widely used for its low cost and relatively simple processes. During the packaging process, bumps disposed on the semiconductor wafer are expected to maintain position at certain locations. Due to the miniature scale of modern integrated circuits, maintaining bump position has become a challenge. Bump bridging and/or shifting issues have been affecting the yield. As a result, there is a need to solve the above deficiencies.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1A:
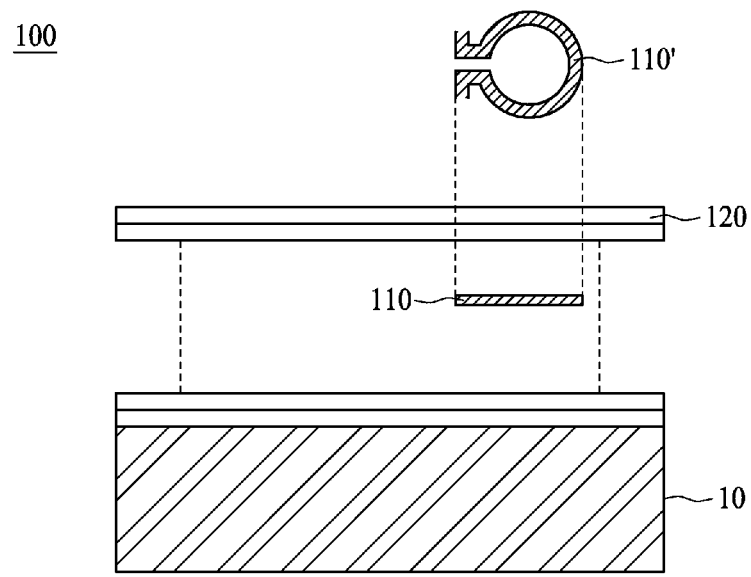
FIGS. 1A and 1B are portions of an exemplary semiconductor device in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 1B:
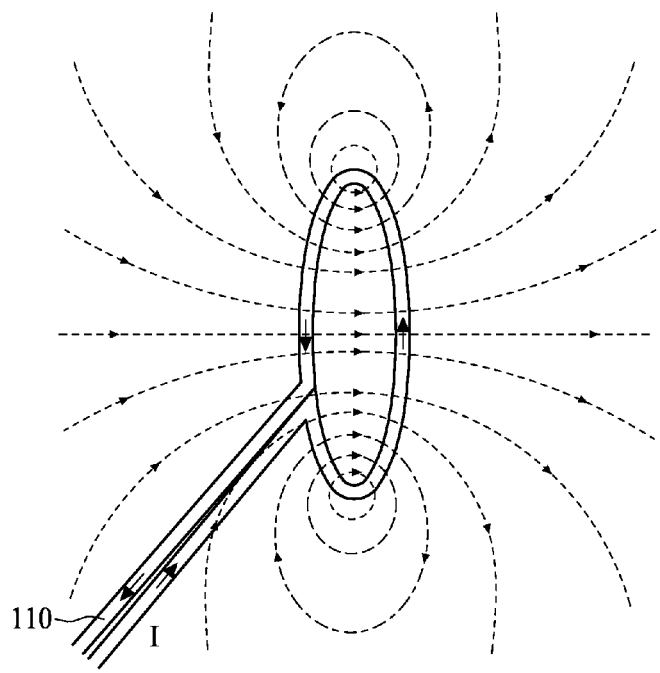

FIGS. 1A and 1B are portions of an exemplary semiconductor device in accordance with some embodiments of the present disclosure.

Referring to FIG. 1A, a portion of a semiconductor device 100 is shown, in accordance with some embodiments. The semiconductor device 100 at least has a semiconductor substrate 10. The semiconductor substrate 10 comprises, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer is, for example, a buried oxide (BOX) layer or a silicon oxide layer. The insulator layer is provided on a substrate, typically a silicon substrate or a glass substrate. Other substrates, such as a multi-layered or gradient substrate, are also used.

Referring to FIG. 1A, in some embodiments in accordance with the present disclosure, the semiconductor substrate 10 referred herein is a bulk semiconductor substrate on which various layers and device structure are formed. In some embodiments, the bulk substrate includes silicon or a compound semiconductor, such as GaAs, InP, Si/Ge, or SiC. Various layers can be formed on the semiconductor substrate. For example, dielectric layers, doped layers, polysilicon layers or conductive layers. Various devices can be formed on the semiconductor substrate. For example, transistors, resistors, and/or capacitors, which may be interconnected through an interconnect layer to additional integrated circuits.

Referring to FIG. 1A, in some embodiments in accordance with the present disclosure, a metal structure 120 is provided over the semiconductor substrate 10. The metal structure 120 is configured to receive a bump (not depicted) during a semiconductor manufacturing process, e.g., a flip-chip (FC) or wafer level chip scale packaging (WLCSP) process. After the bump is deposited onto the metal structure 120, the bump is further treated, such as reflowing. Consequently, the bump is maintained at a specific position on the metal structure 120. In some embodiments, more than one bump is positioned on the metal structure 120. In addition, the arranging pattern of the more than one bump is adjusted according to the needs of specific semiconductor devices, as will be deemed reasonable by persons having ordinary skill in the art.

Referring to FIG. 1A, in some embodiments in accordance with the present disclosure, more than one structure is provided between the semiconductor substrate 10 and the metal structure 120. Such structure includes electrical circuitry, inter-layer dielectric (ILD), an inter-metal dielectric (IMD), metal line, metal pad, conductive pad, protective layer, passivation, interconnect, and so on. Through the patterning, connections and cooperation of the structures, the semiconductor device 100 is designed to perform desirable functions. The structures between the semiconductor substrate 10 and the metal structure 120 are omitted in FIG. 1A for clarity and details of such structures will be discussed later.

Still referring to FIG. 1A, in some embodiments in accordance with the present disclosure, a conductive trace 110 is provided between the semiconductor substrate 10 and the metal structure 120. The conductive trace 110 is provided at, on, within, between or as part of any structure(s) between the semiconductor substrate 10 and the metal structure 120. The conductive trace 110 substantially forms a loop. An opening is preserved at the conductive trace so as to ensure an electric current passes through in a specific direction, for example, clockwise or counter-clockwise. In some embodiments, the body of the conductive trace 110 is substantially c-shaped (as shown by numbering 110' in FIG. 1A). It is to be noted that the perimeter of the conductive trace 110 is not limited to curvy. For example, in some embodiments, the conductive trace 110 is quadrilateral. Conductive trace of other shapes is within the contemplated scope of the present disclosure.

In addition, the conductive trace 110 is configured to connect to a power source (not depicted). Specifically, one end of the conductive trace 110 is configured to couple with a positive pole of the power source, and the other end of the conductive trace 110 is configured to couple with a negative pole of the power source. Thereafter, with reference to FIG. 1B, based on the Biot-Savart Law, when an electric current (represented with symbol "I" in the description hereinafter) from the power source passes through the conductive trace, an electromagnetic field is generated. It is to be noted that the electric current may flow in a different direction and still generate an electromagnetic field.

Referring to FIG. 1B, according to the Biot-Savart Law, the electromagnetic field is more concentrated at the center of the conductive trace 110 than that outside of the conductive trace 110. Therefore, an object containing magnetic or ferromagnetic material will be attracted to a position close to the center of the conductive trace 110 when such object is disposed near the conductive trace 110. Accordingly, in some embodiments in accordance with the present disclosure, the position of the bump received by the metal structure will be adjusted in response to the electromagnetic field generated. For example, the bump is repositioned to a location closer to the center of the conductive trace 110. In some embodiments where multiple bumps are disposed on the metal structure and multiple conductive traces are disposed between the semiconductor substrate and the metal structure, each bump is kept a specific distance from one another in response to the electromagnetic fields generated. It is to be noted that the adjusted position of the bump is not only close to the center of the conductive trace. Bumps being repositioned to other locations desirable for specific semiconductor devices being manufactured are within the contemplated scope of the present disclosure.

FIGS. 2A-2D are cross-sectional views of a semiconductor device in accordance with some embodiments of the present disclosure.

Figure 2A:
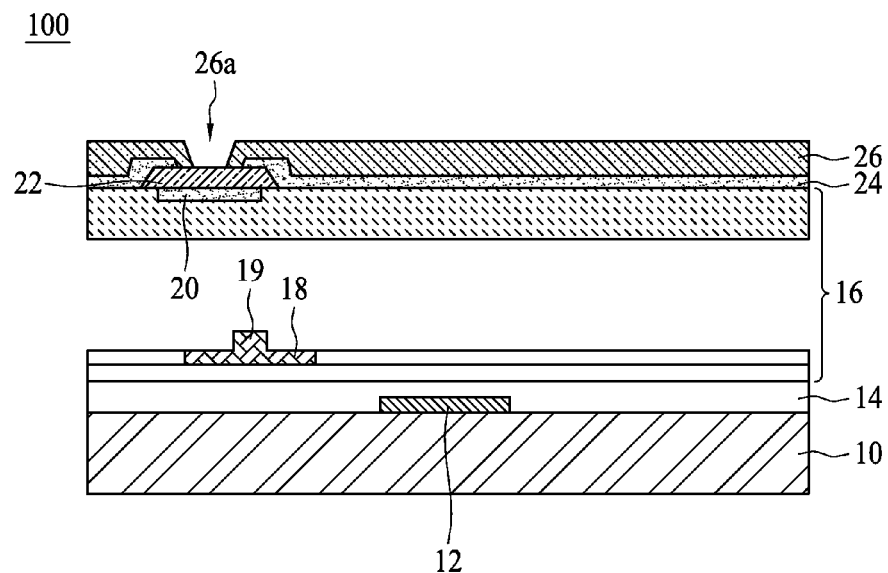
FIGS. 2A-2D are cross-sectional views of a semiconductor device in accordance with some embodiments of the present disclosure.

Referring to FIG. 2A, a portion of a semiconductor substrate 10 of the semiconductor device 100 having electrical circuitry 12 formed thereon is shown. In addition, electrical circuitry 12 is formed on the semiconductor substrate 10 includes be any type of circuitry suitable for a particular application. In an embodiment, the electrical circuitry 12 includes electrical devices formed on the semiconductor substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 includes various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry is also used as appropriate for a given application.

Also shown in FIG. 2A is an inter-layer dielectric (ILD) layer 14. The ILD layer 14 can be formed, for example, of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). It should also be noted that the ILD layer 14 can comprise a plurality of dielectric layers. Contacts (not shown) can be formed through the ILD layer 14 to provide an electrical contact to the electrical circuitry 12. The contacts can be formed of, for example, one or more layers of TaN, Ta, TiN, Ti, CoW, copper, tungsten, aluminum, silver, or the like, or combinations thereof.

One or more inter-metal dielectric (IMD) layers 16 and the associated metallization layers are formed over the ILD layer 14. Generally, the one or more IMD layers 16 and the associated metallization layers (including metal lines 18, via openings 19 and metal layers) are used to interconnect the electrical circuitry 12 to each other and to provide an external electrical connection. The IMD layers 16 can be formed of a low-K dielectric material, such as FSG formed by PECVD techniques or high-density plasma CVD (HDPCVD), or the like, and can include intermediate etch stop layers. It should be noted that one or more etch stop layers (not shown) can be positioned between adjacent ones of the dielectric layers, e.g., the ILD layer 14 and the IMD layers 16. Generally, the etch stop layers provide a mechanism to stop an etching process when forming via openings and/or contacts. The etch stop layers are formed of a dielectric material having a different etch selectivity from adjacent layers, e.g., the underlying semiconductor substrate 10, the overlying ILD layer 14, and the overlying IMD layers 16. In some embodiments, etch stop layers can be formed of SiN, SiCN, SiCO, CN, combinations thereof, or the like, deposited by CVD or PECVD techniques.

In some embodiments, the metallization layers including metal lines 18 and vias 19 are formed of copper or copper alloys, or of other metals. Further, the metallization layers include a top metal layer 20 formed and patterned in or on an uppermost IMD layer to provide external electrical connections and to protect underlying layers from various environmental contaminants. In some embodiments, the uppermost IMD layer is formed of a dielectric material, such as silicon nitride, silicon oxide, undoped silicon glass, and the like. In some embodiments, the top metal layer 20 is formed as a part of the top metallization layer on the uppermost IMD layer.

Thereafter, a conductive pad 22 is formed and patterned to contact the top metal layer 20, or alternatively, electrically coupled to top metal layer 20 through a via. In some embodiments, the conductive pad 22 is formed of aluminum, aluminum copper, aluminum alloys, copper, copper alloys, or the like.

With reference to FIG. 2A, one or more passivation, such as a passivation layer 24, are formed and patterned over the conductive pad 22. In some embodiments, the passivation layer 24 is formed of a dielectric material, such as undoped silicate glass (USG), silicon nitride, silicon oxide, silicon oxynitride or a non-porous material by any suitable method, such as CVD, PVD, or the like. The passivation layer 24 is formed to cover a peripheral portion of the conductive pad 22, and to expose a central portion of conductive pad 22 through an opening in passivation layer 24. The passivation layer 24 is a single layer or a laminated layer. In FIG. 2A, a single layer of conductive pad 22 and a passivation layer 24 are shown for illustrative purposes only. As such, other embodiments may include any number of conductive layers and/or passivation layers.

Next, a dielectric 26 is formed on the passivation layer 24. In some embodiments, the dielectric 26 is patterned to have an opening 26a exposing a portion of the conductive pad 22. The dielectric 26 can be, for example, a polymer layer. The polymer layer can be formed of a polymer material such as an epoxy, polyimide, benzocyclobutene (BCB), polybenzoxazole (PBO), and the like, although other relatively soft, often organic, dielectric materials can also be used. In some embodiments, the dielectric 26 is formed of a non-organic material selected from un-doped silicate glass (USG), silicon nitride, silicon oxynitride, silicon oxide, and combinations thereof. The formation methods of the dielectric 26 include spin coating or other methods. In some embodiments, the dielectric 26 is an optional layer, which can be skipped in the semiconductor device.

Figure 2B:
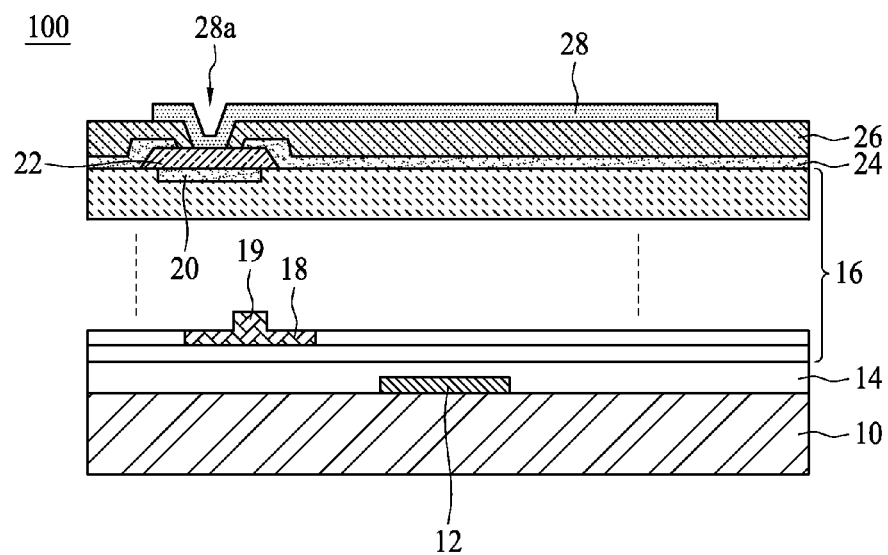

Referring to FIG. 2B, in some embodiments in accordance with the present disclosure, at least one metallization layer is formed on the dielectric 26 and fills the opening 26a. The at least one metallization layer is then patterned as an interconnect layer 28, which is electrically connected to the conductive pad 22 and exposes a portion of the underlying dielectric 26. In at least an embodiment, the interconnect layer 28 is a post-passivation interconnect (PPI) structure 28, which also functions as power lines, re-distribution lines (RDL), inductors, capacitors or any passive components. In some embodiments, the PPI structure 28 includes copper, aluminum, copper alloy, or other mobile conductive materials using plating, electroless plating, sputtering, chemical vapor deposition methods, and the like. In one embodiment, the PPI structure 28 includes a copper layer or a copper alloy layer. In the embodiment of FIG. 2B, the PPI structure 28 has a recess 28a.

The recess 28a is configured to receive the bump (not depicted). Alternatively, the bump is disposed not at the recess 28a. In certain embodiments, with reference to FIG. 2C, a bump 40 is disposed at any position on the PPI structure 28 as deemed desirable by persons having ordinary skill in the art. In some embodiments, the bump 40 is a solder, a conductor or a pillar. Bump of other configurations are within the contemplated scope of the present disclosure.

Figure 2C:
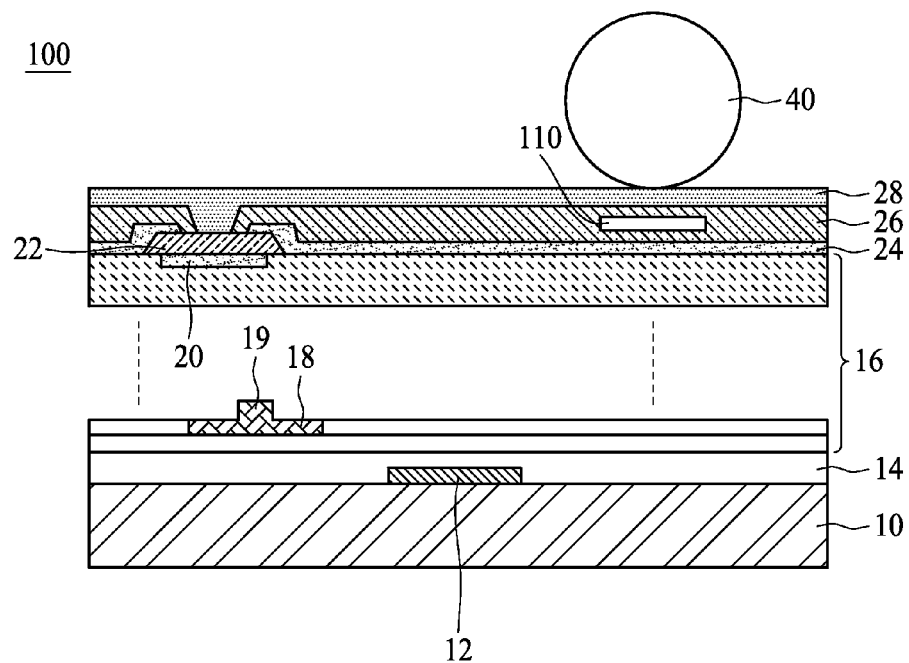

Referring to FIG. 2C, in some embodiments in accordance with the present disclosure, the interconnect layer 28 has a substantially flat top surface. In addition, the substantially flat top surface of the interconnect layer 28 is configured to receive the bump 40. Through the interconnect layer 28, the bump 40 is electrically connected to the conductive pad 22. The bump 40 can be a Cu bump or a metal bump including Ni or Au. In some embodiments, the bump 40 is formed by disposing a solder ball to the PPI structure 28 and then thermally reflowing the solder ball. In some embodiments, the solder 40 includes a lead-free pre-solder layer, SnAg, or a solder material including alloys of tin, lead, silver, copper, nickel, bismuth, or combinations thereof. In some embodiments, the bump 40 is formed by plating a solder layer with photolithography technologies followed by reflowing processes. In some embodiments, the bump 40 includes "microbumps". In certain embodiments, the bump 40 is made of a magnetic or ferromagnetic material.

After the bump formation, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 2D:
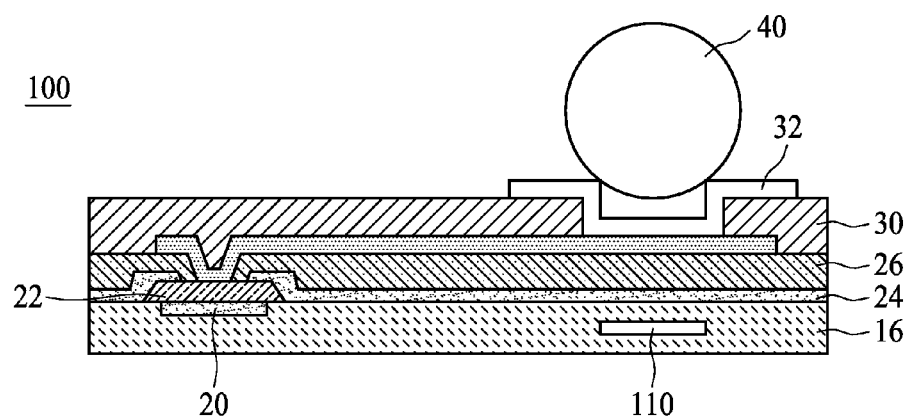

Referring to FIG. 2D, in some embodiments in accordance with the present disclosure, a protective layer 30 is formed on the semiconductor substrate 10 to cover the PPI structure 28. In some embodiments, the protective layer 30 is formed of a polymer layer, such as an epoxy, polyimide, benzocyclobutene (BCB), polybenzoxazole (PBO), and the like, although other relatively soft, often organic, dielectric materials are also used. In some embodiments, the protective layer 30 is formed of a non-organic material selected from un-doped silicate glass (USG), silicon nitride, silicon oxynitride, silicon oxide, and combinations thereof. Using photolithography and/or etching processes, the protective layer 30 is further patterned to form a recess, which is filled by an under bump metallization (UBM) 32. The UBM 32 is formed in the recess of the protective layer 30 by using metal deposition, photolithography and etching methods. In some embodiments, the UBM 32 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM 32 includes at least one Ti-containing layer and at least one Cu-containing layer. In some embodiments, the top surface of the UBM 32 has a recess.

A bump 40 is successively formed on the UBM 32. In some embodiments, the bump 40 is formed by disposing a solder ball to the UBM 32 and then thermally reflowing the solder ball. Details of the bump 40 have been described in the foregoing paragraphs and will not be repeated.

With reference to FIGS. 1A, 2C and 2D, in some embodiments in accordance with the present disclosure, the conductive trace 110 is provided at, on, within, between or as part of any structure(s) between the semiconductor substrate 10 and the metal structure 120. In some embodiments, the metal structure 120 is the PPI structure 28. In certain embodiments, the metal structure 120 is the UBM 32. It is to be noted that the metal structure 120 is not limited to the aforementioned. In other words, the metal structure 120 is any structure possessing the characteristic of a conductive metal and capable of receiving the bump 40. For example, the metal structure 120 is a portion of a redistribution layer (RDL).

In addition, the conductive trace 110 is provided at, on, within, between, or as part of the ILD layer 14, the IMD layer 16, the top metal layer 20, the passivation layer 24, the dielectric 26, the interconnect 28, the protective layer 30, and/or the UBM 32. Alternatively, the conductive trace 110 is at any position between the metal structure 120 and the semiconductor substrate 10 as long as the electromagnetic field generated at the conductive trace 110 is configured to adjust the position of the bump 40 disposed on the metal structure 120. Referring to FIG. 2C, in some embodiments in accordance with the present disclosure, the conductive trace 110 is at the dielectric 26. Referring to FIG. 2D, in some embodiments in accordance with the present disclosure, the conductive trace 110 is at the IMD layer 16.

In subsequent cross-sectional drawings, semiconductor substrate 10, electrical circuitry 12, ILD layer 14, IMD layers 16, metallization layers 18 and 19, and top metal layer 20 may not be illustrated, and the conductive pad 22 may be formed as a part of the passivation 24.

Figure 3A:
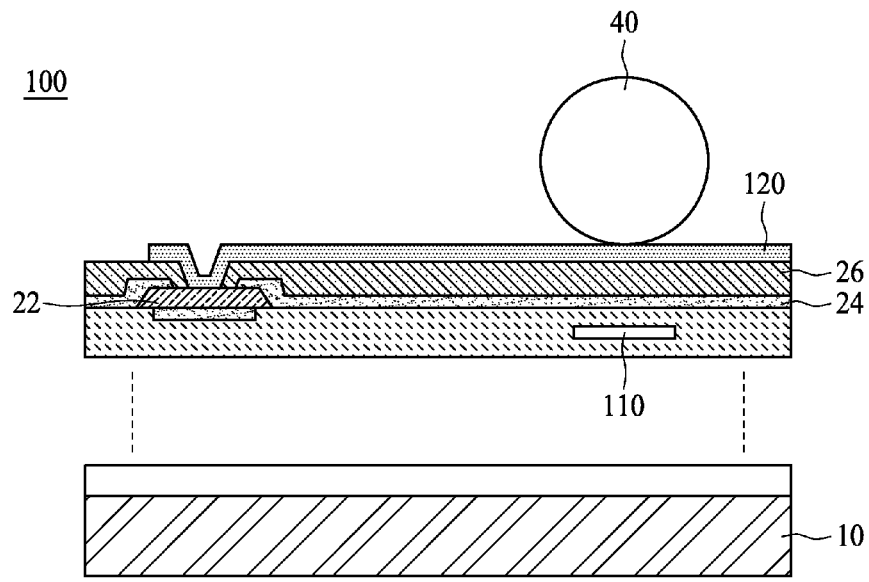
FIGS. 3A and 3B are cross-sectional views of a semiconductor device in accordance with some embodiments of the present disclosure.
Figure 3B:
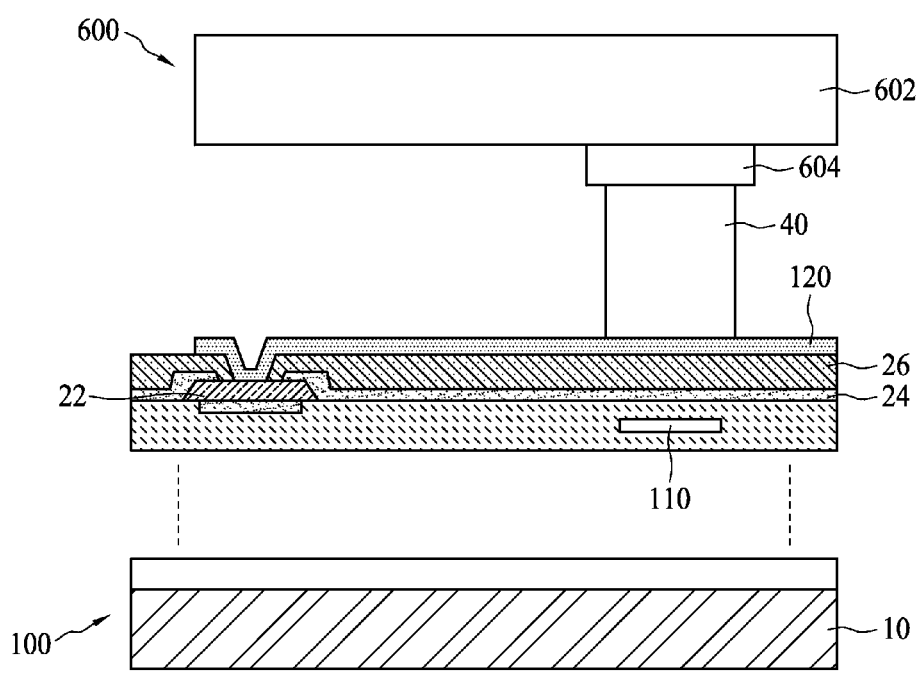

FIGS. 3A and 3B are a cross-sectional views of a semiconductor device in accordance with some embodiments of the present disclosure.

Referring to FIG. 3A, in some embodiments in accordance to the present disclosure, a semiconductor device 100 is provided. The semiconductor device 100 has a conductive trace 110 between the semiconductor substrate 10 and the metal structure 120. The conductive trace 110 is connected to a power source (not depicted). In addition, the conductive trace 110 is covered by a passivation layer 24. A dielectric 26 is provided between the passivation layer 24 and the metal structure 120. In some embodiments, the metal structure 120 is an interconnect layer. In certain embodiments, the metal structure 120 is a post-passivation interconnect (PPI) structure.

Moreover, the bump 40 is disposed on the metal structure 120. A flux (not depicted) may be deposited between the bump 40 and the metal structure 120. In some embodiments, the bump 40 is configured to be disposed substantially above the conductive trace 110. An electric current from the power source is configured to pass through the conductive trace 110 so as to generate an electromagnetic field at the conductive trace 110. The electromagnetic field is configured to adjust the position of the bump 40 to a specific position. In certain embodiments, the position of the bump 40 is adjusted to near the center of the center of the conductive trace 110, where the electromagnetic field is the strongest.

In some embodiments in accordance to the present disclosure, the semiconductor substrate 10 further has a semiconductor chip. The semiconductor chip has a top metal layer. In addition, the conductive trace 110 is part of the top metal layer. The metal structure 120 is configured over the top metal layer, and the bump 40 is configured to be disposed on the metal structure 120. The conductive trace 110 is configured to connect to a power source. When an electric current from the power source passes through the conductive trace 110, an electromagnetic field is generated. Accordingly, the position of the bump 40 is adjusted in response to the electromagnetic field.

In some embodiments in accordance with the present disclosure, in order to be magnetically attracted by the electromagnetic field, the bump 40 contains one or more ferromagnetic material. In certain embodiments, the bump 40 contains one or more magnetic material.

Referring to FIG. 3B, in some embodiments in accordance with the present disclosure, a semiconductor device 100 is configured to bonded with another semiconductor device 600. In some embodiments, the semiconductor device 600 is a semiconductor package, a printed circuit board (PCB) or etc. In some embodiments, the semiconductor device 600 includes a substrate 602 and a pad 604 disposed on the substrate 602. In some embodiments, the substrate 602 includes a circuit within the substrate 602. In some embodiments, the substrate 602 includes silicon, ceramic, copper or etc.

In some embodiments, the pad 604 is electrically connected with the circuit within the substrate 602. In some embodiments, the pad 604 is configured for receiving a conductive bump. In some embodiments, the pad 604 includes chromium (Cr), copper (Cu), gold (Au), titanium (Ti) or tungsten (W), etc.

In some embodiments, the semiconductor device 600 is mounted on the semiconductor device 100 by bonding a bump 40 of the semiconductor device 100 with the pad 604 of the semiconductor device 600. The bump 40 is attached with the pad 604, so that the circuit within the substrate 10 of the semiconductor device 100 is electrically connected with the circuit within the substrate 602 of the semiconductor device 600 through the conductive pad 22, the metal structure 120, the bump 40 and the pad 604.

In some embodiments, after bonding the semiconductor device 100 and the semiconductor device 600, a semiconductor package is formed as a final product or as an intermediate product for subsequent operations. In some embodiments, when both semiconductor devices 100 and 600 are a package respectively, a package on package (PoP) is formed.

FIGS. 4A-4F are tops views of a semiconductor device in accordance with some embodiments of the present disclosure.

Figure 4A:
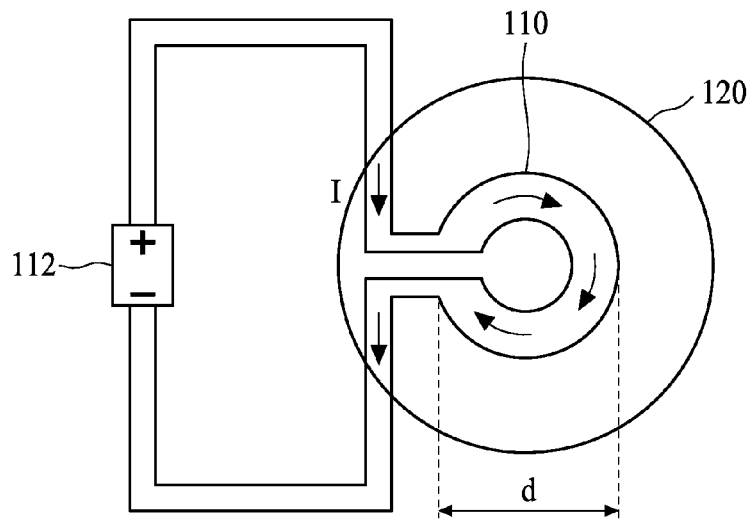
FIGS. 4A-4F are tops views of a semiconductor device in accordance with some embodiments of the present disclosure.

Referring to FIG. 4A, in some embodiments in accordance with the present disclosure, a conductive trace 110 is provided between the semiconductor substrate (not depicted) and the metal structure 120. One end of the conductive trace 110 is configured to be coupled with one pole of a power source 112, and another end of the conductive trace 110 is configured to be coupled with another pole of the power source 112. The power source 112 is configured to provide electric current I to the conductive trace 110.

The conductive trace 110 is substantially a loop. In other words, an opening is preserved at the conductive trace 110 to ensure the electric current I passes through in a specific direction, for example, clockwise or counter-clockwise. In some embodiments, the conductive trace 110 is c-shaped, as illustrated in FIG. 4A. When the electric current I from the power source 112 runs through the c-shaped conductive trace 110, an electromagnetic field is generated at the c-shaped conductive trace 110 according to the Biot-Savart Law. When a bump (not depicted) is disposed on the metal structure 120, the position of the bump is adjusted in response to the electromagnetic field. The bump further undergoes treatments, e.g., thermal reflow, to be secured to the metal structure 120. As a result, the position of the bump on the metal structure 120 is maintained substantially above the c-shaped conductive trace 110.

In some embodiments in accordance with the present disclosure, an outer dimension (represented with symbol "d") is between about 100 μm and about 300 μm. In certain embodiments, the outer dimension d is between about 180 μm and about 230 μm.

In some embodiments in accordance with the present disclosure, the amperage of the electric current I output by the power source 112 is between about 0.5 Amperes and about 2 Amperes. Moreover, the intensity of the electromagnetic field generated at the c-shaped conductive trace is between about 50 Gauss and about 150 Gauss. In certain embodiments, the amperage of the electric current I output by the power source 112 is between about 0.75 Amperes and about 1.25 Amperes. Moreover, the intensity of the electromagnetic field generated at the c-shaped conductive trace is between about 50 Gauss and about 75 Gauss.

Figure 4B:
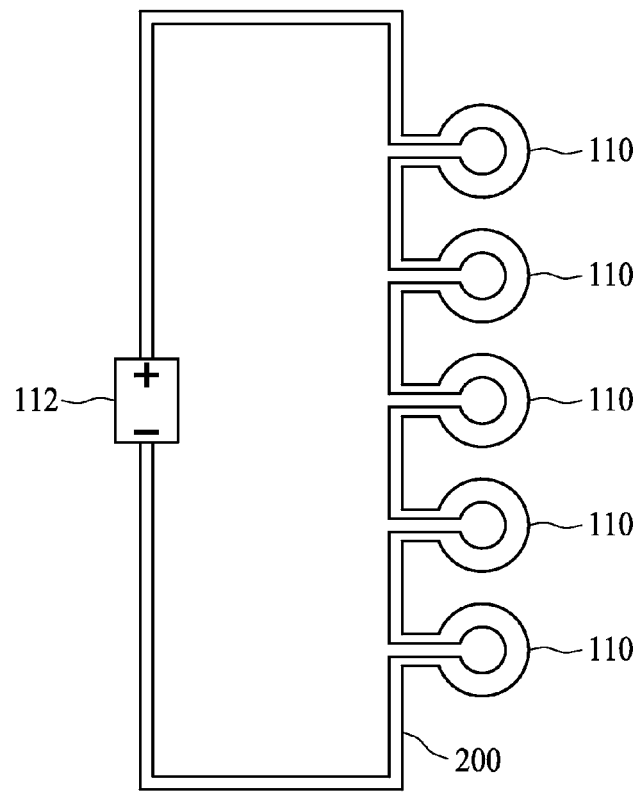

Referring to FIG. 4B, in some embodiments in accordance with the present disclosure, a string of c-shaped conductive traces 110 is provided between the semiconductor substrate and the metal structure. (The semiconductor substrate and the metal structure are omitted for clarity.) The string of c-shaped conductive traces 110 is configured to be coupled to a power source 112 in a serial mode. When the electric current I from the power source 112 runs through the string of c-shaped conductive traces 110, electromagnetic fields are generated at each of the c-shaped conductive traces 110. Consequently, when multiple bumps are disposed on the metal structure, positions of the bumps are adjusted respectively according to the electromagnetic field at each of the c-shaped conductive trace 110 below.

In some embodiments, the string of c-shaped conductive traces 110 is a Daisy chain 200. The Daisy chain 200 is a wiring scheme in which multiple devices are wired together in sequence or in a ring. In certain embodiments, the Daisy chain 200 is used for transmission or detection of power, analog signals, digital data, or a combination thereof.

Figure 4C:
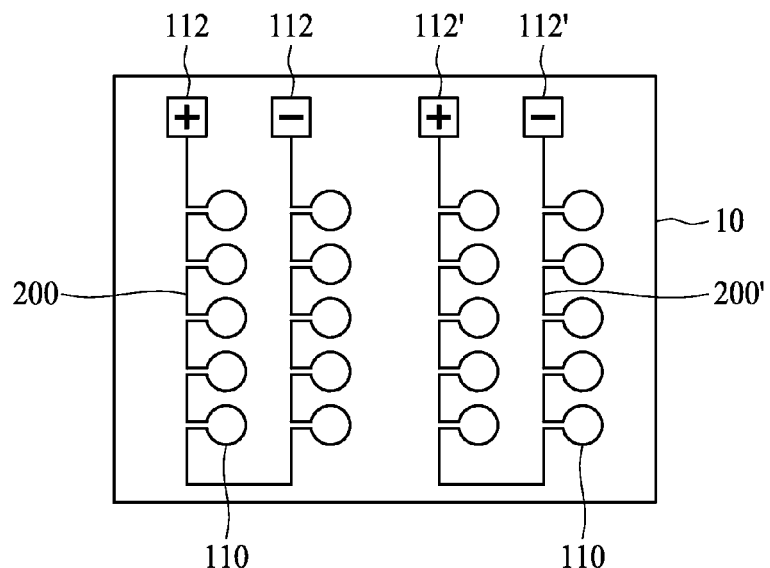

Referring to FIG. 4C, in some embodiments in accordance with the present disclosure, two strings of c-shaped conductive traces 110 are provided between the semiconductor substrate 10 and the metal structure. (The metal structure is omitted for clarity.) In other words, two Daisy chains 200, 200' are provided. In some embodiments, the two strings of c-shaped conductive traces 110 are connected in a parallel mode. The first string of c-shaped conductive traces is coupled to a first power source 112, and the second string of c-shaped conductive traces is coupled to a second power source 112'. Alternatively, the two strings of c-shaped conductive traces are connected in a serial mode. In other words, the two strings of c-shaped conductive traces at the semiconductor substrate 10 are connected to a single power source serially. It is to be noted that the number of strings of c-shaped conductive traces is not limited to two. Different numbers of strings of c-shaped conductive traces are within the contemplated scope of the present disclosure.

Figure 4D:
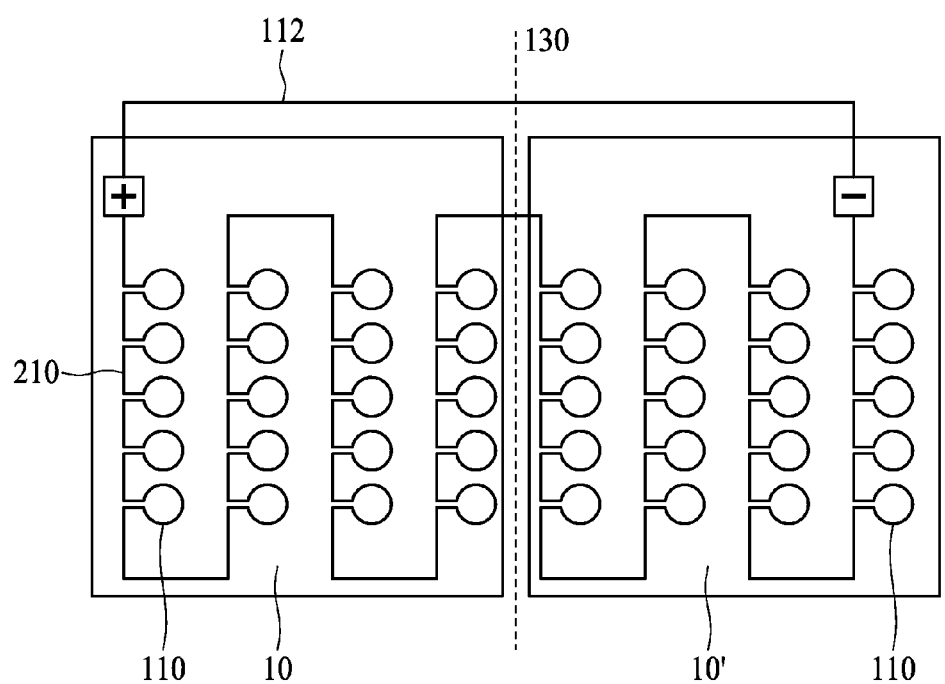

Referring to FIG. 4D, in some embodiments in accordance with the present disclosure, two strings of c-shaped conductive traces are provided at two semiconductor substrates 10, 10'. In addition, the two strings of c-shaped conductive traces are connected in a serial mode. In other words, one Daisy chain 200 is provided over two semiconductor substrates 10, 10'. One end of the Daisy chain 200 is configured to be coupled with one pole of the power source 112, and the other end of the Daisy chain 200 is configured to be coupled with another pole of the power source 112. In certain embodiments, the two strings of c-shaped conductive traces are separated by a dicing scribe line 130. The dicing scribe line 130 is configured to separate the semiconductor substrates 10, 10'. One end of the string of c-shaped conductive traces at one semiconductor substrate 10 is connected to one end of the string of c-shaped conductive traces at another semiconductor substrate 10' across the dicing scribe line 130. The other end of each of the string of c-shaped conductive traces on different semiconductor substrates 10, 10' is coupled to different poles of the power source 112 respectively. Accordingly, two strings of c-shaped conductive traces 110 at different semiconductor substrates 10, 10' are connected in a serial mode.

In some embodiments in accordance with the present disclosure, the string of c-shaped conductive traces is not in the form of an array. For example, the string of c-shaped conductive traces may be arranged in a staggered configuration (not depicted).

Figure 4E:
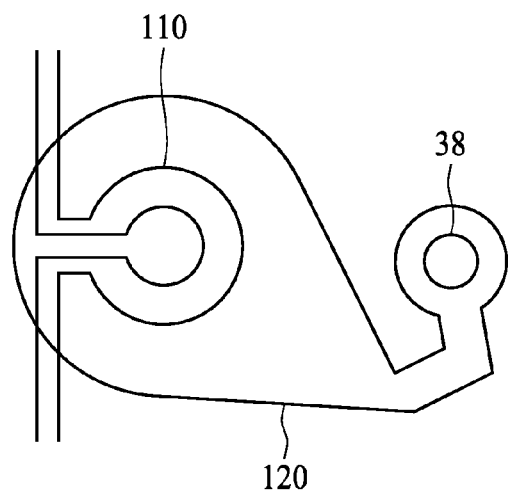
Figure 4F:
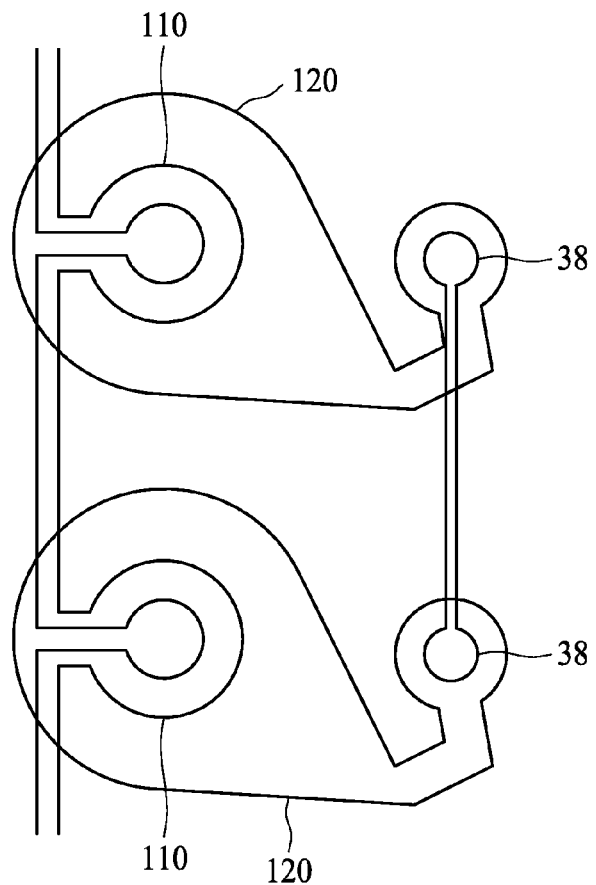

Referring to FIG. 4E, in some embodiments in accordance with the present disclosure, the metal structure 120 has a protruding portion proximal to a bond pad 38 of a semiconductor chip (not depicted). The semiconductor chip is under the c-shaped conductive trace 110. The protruding portion of the metal structure 120 is configured to extend away from the c-shaped conductive trace 110 to cover the bond pad 38 of the semiconductor chip. Referring to FIG. 4F, in some embodiments in accordance with the present disclosure, the adjacent bonding pads 38 of two semiconductor chips (not depicted) are electrically connected through a trace. Accordingly, two adjacent metal structures 120 above the c-shaped conductive traces 110 are electrically connected with each other through the connection between the bond pads 38.

Figure 5:
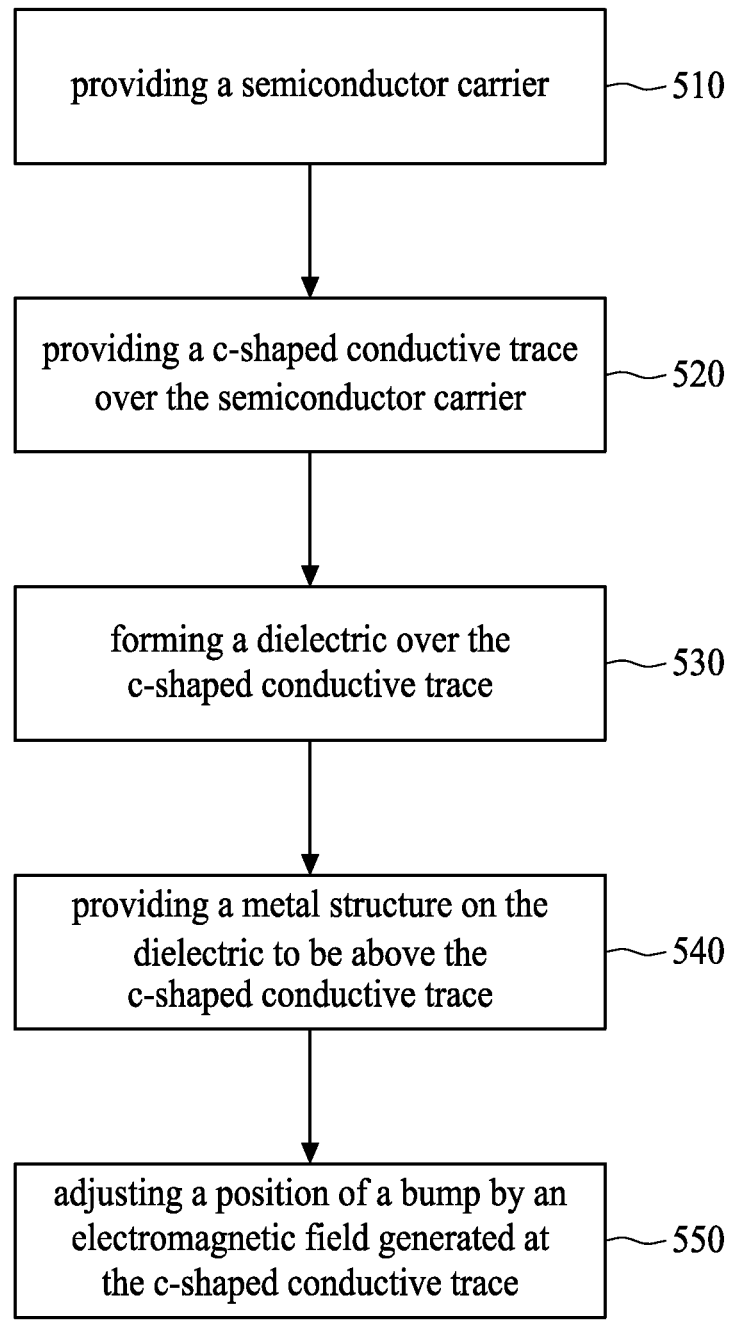
FIG. 5 is a semiconductor device manufacturing method in accordance with some embodiments of the present disclosure.

FIG. 5 is a semiconductor device manufacturing method in accordance with some embodiments of the present disclosure.

In operation 510, a semiconductor substrate is provided at a semiconductor device. In operation 520, a c-shaped conductive trace is provided over the semiconductor substrate. The c-shaped conductive trace is connected to a power source so as to receive an electric current from the power source. In operation 530, a dielectric is formed over the c-shaped conductive trace. In operation 540, a metal structure is provided over the dielectric. Accordingly, the metal structure is above the c-shaped conductive trace. In operation 550, a position of a bump is adjusted by an electromagnetic field generated at the c-shaped conductive trace.

In some embodiments in accordance with the present disclosure, the semiconductor device manufacturing method further includes disposing a bump over the metal structure. The bump is deposited substantially above the c-shaped conductive trace. The bump contains ferromagnetic material. In certain embodiments, a flux is provided between the bump and the metal structure.

In some embodiments in accordance with the present disclosure, the semiconductor device manufacturing method further includes providing an electric current to the c-shaped conductive trace so as to create an electromagnetic field. The electric current is provided by the power source. Due to the configuration of the c-shaped conductive trace, i.e., substantially a loop, the electric current that runs through the c-shaped conductive trace generates an electromagnetic field according to the Biot-Savart Law. Consequently, the position of the bump on the metal structure is adjusted in response to the electromagnetic field generated. In other words, the bump is aligned substantially above the c-shaped conductive trace in accordance with the electromagnetic field generated. Thereafter, after further treatment, such as thermal reflow, the bump is secured at a position on the metal structure substantially above the c-shaped conductive trace.

In some embodiment, a semiconductor device having a semiconductor substrate is provided. The semiconductor device further has a metal structure over the semiconductor substrate. The metal structure is configured to receive a bump.

Moreover, the semiconductor device has a conducive trace between the semiconductor substrate and the metal structure. The conductive trace is configured to connect to a power source. When an electric current from the power source passes through the conductive trace, an electromagnetic field is generated at the conductive trace. In certain embodiments, the bump contains a ferromagnetic material, and the bump is configured to be positioned substantially above the conductive trace.

In some embodiments, the metal structure has a substantially flat top surface for receiving the bump. In addition, the metal structure is a portion of a redistribution layer (RDL). In certain embodiments, the metal structure is an under bumper metallurgy (UBM).

In some embodiments, the semiconductor substrate comprises a passivation layer covering the conductive trace. In certain embodiments, the semiconductor substrate comprises a semiconductor chip. The semiconductor chip includes a top metal layer, and the conductive trace is a portion of the top metal layer.

In some embodiments, a semiconductor device having a metal structure overlying a semiconductor substrate is provided. The semiconductor device further has a conductive trace under the metal structure. The c-shaped conductive trace is configured to be coupled to a power source. In other words, one end of the conductive trace is configured to be coupled with a first pole of the power source, and another end of the conductive trace is configured to be coupled with the second pole of the power source. When an electric current from the power source runs through the conductive trace, an electromagnetic field is generated at the conductive trace. In some embodiments, the electromagnetic field is configured to adjust a position of the bump. In certain embodiments, an outer dimension of the conductive trace is between about 100 µm and about 300 µm.

In some embodiments, the semiconductor device has a string of conductive traces. In certain embodiments, the string of conductive traces is a Daisy chain.

In some embodiments, the semiconductor device has at least two strings of conductive traces connected in a parallel mode. In some embodiments, the semiconductor device has at least two strings of conductive traces connected in a serial mode. In certain embodiments, the at least two strings of conductive traces are separated by a dicing scribe line.

In some embodiments, the metal structure has a protruding portion proximal to a bond pad of a semiconductor chip, and the semiconductor chip is under the conductive trace.

In some embodiments, a method for manufacturing semiconductor device includes providing a semiconductor substrate and providing a c-shaped conductive trace over the semiconductor substrate. A dielectric is formed over the c-shaped conductive trace. In addition, a metal structure is provided over the dielectric layer to be above the c-shaped conductive trace. Moreover, a position of a bump is adjusted by an electromagnetic field generated at the c-shaped conductive trace.

In some embodiments, the method further includes disposing a bump over the metal pad. In certain embodiments, the method further includes providing an electric current to the c-shaped conductive trace so as to create an electromagnetic field.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a semiconductor substrate;
   a metal structure over the semiconductor substrate, wherein the metal structure is configured to receive a bump; and
   a conductive trace between the semiconductor substrate and the metal structure, wherein the conductive trace is configured to connect to a power source,
   wherein the conductive trace includes a loop portion, and an electromagnetic field is generated at the loop portion of the conductive trace upon passing an electric current from the power source through the conductive trace.

2. The semiconductor device according to claim 1, wherein the metal structure includes a substantially flat top surface for receiving the bump.

3. The semiconductor device according to claim 2, wherein the metal structure is a portion of a redistribution layer (RDL).

4. The semiconductor device according to claim 1, wherein the semiconductor substrate further comprising a passivation layer covering the conductive trace.

5. The semiconductor device according to claim 1, wherein the bump is configured to be positioned substantially above the conductive trace.

6. The semiconductor device according to claim 1, wherein an outer dimension of the conductive trace is between about 100 µm and about 300 µm.

7. The semiconductor device according to claim 1, wherein the loop portion of the conductive trace is in a substantially loop shape.

8. A semiconductor device, comprising:
   a semiconductor substrate;
   a metal structure over the semiconductor substrate, wherein the metal structure is configured to receive a bump; and
   a conductive trace between the semiconductor substrate and the metal structure, wherein the conductive trace is configured to connect to a power source,
   wherein an electromagnetic field is generated at a loop portion of the conductive trace when an electric current from the power source passes through the conductive trace, and the electromagnetic field is configured to magnetically attract the bump, thereby the bump is disposed over the metal structure and adjacent to the loop portion of the conductive trace.

9. The semiconductor device according to claim 8, wherein a position of the bump is adjusted to near a center of the loop portion of the conductive trace.

10. The semiconductor device according to claim 8, wherein the conductive trace is disposed within a dielectric, an interlayer dielectric (ILD) or an intermetallic dielectric (IMD) layer of the semiconductor substrate.

11. The semiconductor device according to claim 8, wherein the metal structure is a post-passivation interconnect (PPI) structure.

12. The semiconductor device according to claim 8, wherein the semiconductor substrate further comprising a semiconductor chip, wherein the semiconductor chip includes a top metal layer, and the conductive trace is a portion of the top metal layer.

13. The semiconductor device according to claim 8, wherein the bump contains a ferromagnetic material.

14. The semiconductor device according to claim 8, wherein the metal structure is an under bumper metallurgy (UBM).

15. The semiconductor device according to claim 12, wherein the semiconductor chip is disposed under the conductive trace.

16. A method for manufacturing semiconductor device, comprising:

providing a semiconductor substrate;
providing a c-shaped conductive trace over the semiconductor substrate;
forming a dielectric over the c-shaped conductive trace;
providing a metal structure over the dielectric to be above the c-shaped conductive trace; and
adjusting a position of a bump by an electromagnetic field generated at the c-shaped conductive trace.

17. The method according to claim 16, further comprising: disposing the bump over the metal structure.

18. The method according to claim 16, further comprising: providing an electric current to the c-shaped conductive trace so as to create an electromagnetic field.

19. The method according to claim 16, further comprising connecting the c-shape conductive trace to a power source.

20. The method according to claim 16, further comprising aligning the bump substantially above the c-shaped conductive trace in accordance with the electromagnetic field generated.

* * * * *